(12) United States Patent
Geraghty et al.

(10) Patent No.: US 6,885,329 B2
(45) Date of Patent: Apr. 26, 2005

(54) SIGNAL GENERATION USING DAC HAVING SELECTIVELY SWITCHED REGISTERS STORING OUTPUT VALUES

(75) Inventors: Donal P. Geraghty, Limerick (IE); Albert C. O'Grady, County Limerick (IE); Tudor M. Vinereanu, Cork (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/866,309

(22) Filed: Jun. 10, 2004

(65) Prior Publication Data

US 2005/0007265 A1 Jan. 13, 2005

Related U.S. Application Data

(63) Continuation of application No. 10/353,681, filed on Jan. 29, 2003.

(51) Int. Cl.$^7$ .............................................. H03M 1/66
(52) U.S. Cl. ...................................... 341/148; 341/144
(58) Field of Search .............................. 341/141, 144, 341/152, 148

(56) References Cited

U.S. PATENT DOCUMENTS

| 4,816,830 A | * | 3/1989 | Cooper ........................ 341/153 |
| 5,918,198 A | | 6/1999 | Ricca et al. |
| 6,356,224 B1 | | 3/2002 | Wohlfarth |
| 6,362,766 B1 | * | 3/2002 | Rowan et al. ............... 341/152 |
| 6,549,157 B1 | | 4/2003 | Tseng et al. |

FOREIGN PATENT DOCUMENTS

| FR | 2638915 | 5/1990 |
| GB | 2010032 | 6/1979 |
| JP | 2001024441 | 1/2001 |

OTHER PUBLICATIONS

TQ6122 single page product literature from Triquint Semiconductors, Inc., www.triquint.com, date unknown.
Schreib–Lese–Speicher (RAM), Statische RAMs, pp. 713–715, no date.

"Function generator/arbitrary waveform generator", University of Pennsylvania, Dept of Electrical Engineering, Jan. 8, 2002.

Bryant, James M., "A function generator and linearization circuit using the AD7569", Analog Devices, date unknown.

Toomey, Paul, "Improve function generators with matched D/A converters", Analog Devices, May 12, 1982, pp. 8–161—8–166.

"MAXIM, 10–bit, 40MHz, current/voltage–output DACs", Maxim Integrated Products, pp. 1–18, no date.

* cited by examiner

*Primary Examiner*—Howard L. Williams
(74) *Attorney, Agent, or Firm*—Wolf, Greenfield & Sacks, P.C.

(57) ABSTRACT

A signal generator (1) for generating a square waveform analog voltage output signal comprises an on-chip DAC (12) which outputs the analog voltage signal on an output terminal (5). On-chip first and second programmable registers (9,10) store first and second digital words which correspond to the maximum and minimum voltage values of the analog output signal. An on-chip switch circuit (15) selectively and alternately switches the first and second registers (9,10) to an on-chip DAC register (17) from which the respective first and second digital words are loaded into the DAC (12) in response to a load DAC signal generated by a control circuit (14). The load DAC signal is generated in response to an externally generated LDAC signal in the form of a clock signal which is applied to an LDAC terminal (22). A flip-flop (19) in response to the load DAC signal outputs a control signal on a control line (25) for alternately switching the first and second registers (9,10) to the DAC register (17). The frequency of the analog output signal is determined by the frequency of the LDAC signal, and is half the frequency of the LDAC signal.

20 Claims, 4 Drawing Sheets

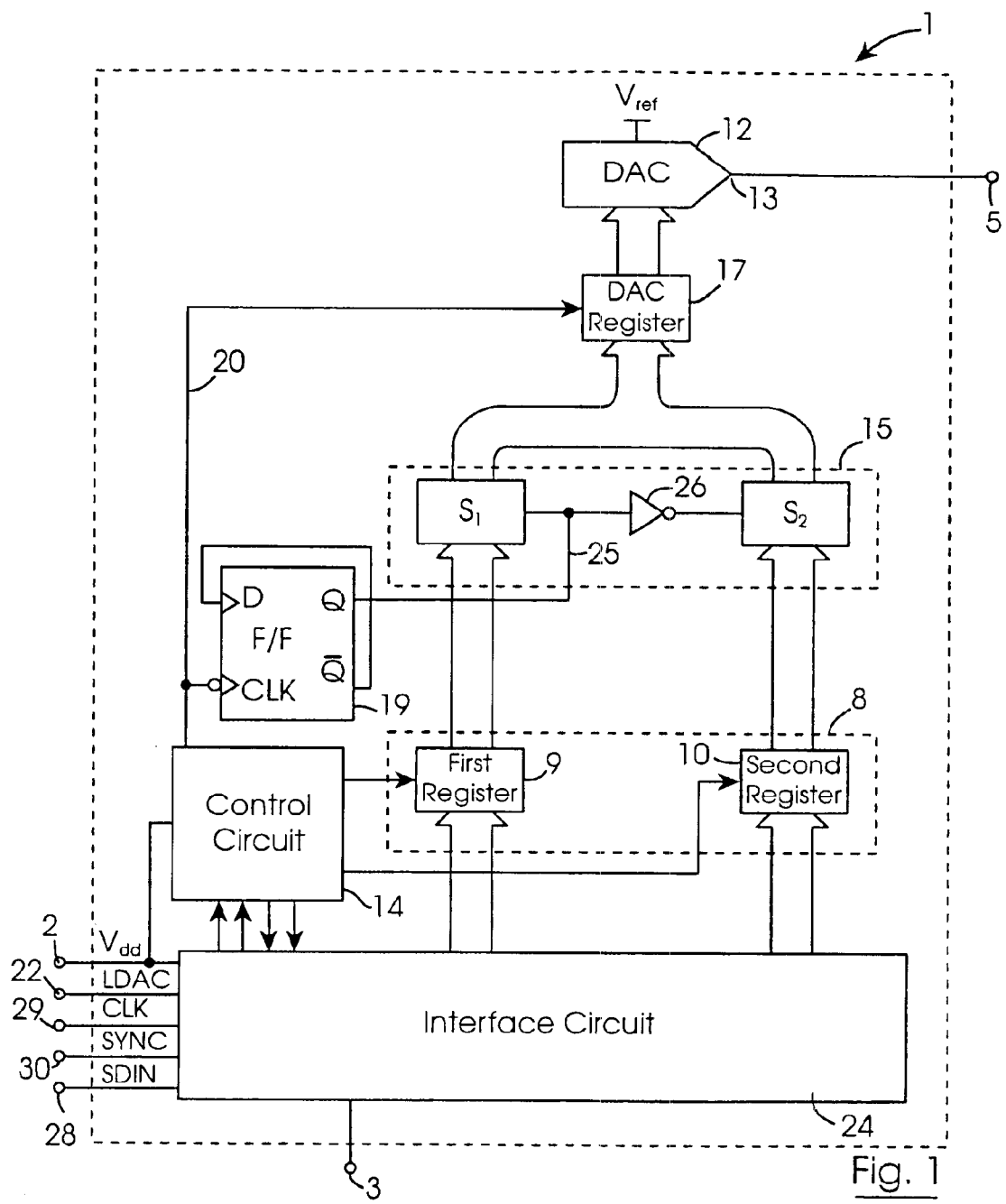
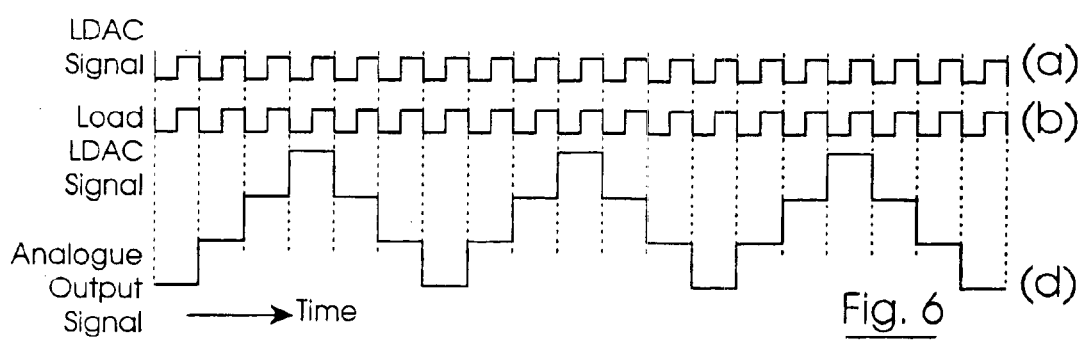
Fig. 1
Fig. 6

SIGNAL GENERATION USING DAC HAVING SELECTIVELY SWITCHED REGISTERS STORING OUTPUT VALUES

CROSS REFERENCE TO RELATED APPLICATION

The present application is a continuation of prior U.S. application Ser. No. 10/353,681, filed Jan. 29, 2003, which is still pending, entitled "Integrated Circuit Signal Generator and a Method for Generating an Analog Output Signal Representative of a Waveform," which is hereby incorporated herein by reference.

FIELD OF THE INVENTION

The present invention relates to an integrated circuit signal generator for generating an analog output signal representative of a waveform, and in particular, a square or a step waveform, and the invention also relates to a method for generating an analog output signal representative of such waveforms.

BACKGROUND TO THE INVENTION

Signal generators are known for generating analog signals representative of various waveforms, which typically, are voltage signals. Such signal generators typically comprise a circuit which outputs a voltage signal representative of the desired waveform. By applying the output voltage signal to a cathode ray tube, or other suitable visual display unit, a waveform representing the output signal is displayed. In their simplest such circuits may include a switch circuit which periodically switches a supply voltage $V_{dd}$ on and off, and the switched voltage is applied to an output terminal which alternates between the supply voltage and ground, thereby producing an analog output voltage signal representative of a square waveform. The frequency of the output signal is selected by selecting the frequency with which the switch circuit switches on and off the supply voltage to the output terminal. The mark/space ratio of the output signal is selected by selecting the durations of the periods during which the supply voltage is switched to the output terminal, and is isolated therefrom. However, a problem with such signal generators is that in general, they are suitable only for generating an output signal representative of a square waveform which oscillates between a fixed maximum value, which typically, is the value of the supply voltage $V_{dd}$, and a fixed minimum value, which typically is ground. Without the addition of relatively complex circuitry, it is not possible to vary the maximum and minimum voltage values between which the output signal swings.

Signal generators which comprise a digital to analog converter (DAC), for example, a voltage DAC, are also known. The DAC outputs an analog voltage signal which is representative of the desired waveform. A plurality of digital words which correspond to voltage values of the waveform are sequentially applied to the DAC from an external circuit in an appropriate sequence, and at appropriate time intervals so that the DAC outputs an analog output signal which is representative of the desired waveform.

While such signal generators comprising a DAC are suitable for generating an analog output signal representative of a desired waveform, they suffer from a number of disadvantages. Firstly, they tend to be inefficient, in that they do not utilise the DAC to its maximum efficiency, and secondly, they require external circuitry for storing digital words which correspond to desired voltage values of the output signal. The external circuitry requires programming in order that the digital words are applied to the DAC in the appropriate sequence and at the appropriate time intervals so that the analog signal outputted by the DAC is representative of the desired waveform. A further disadvantage, and a particularly serious disadvantage is that the digital words must be transferred from the external circuitry to the DAC, for in turn loading into the DAC, and this can significantly slow down the operation of the DAC, particularly where the digital link between the external circuitry and the DAC is through a serial interface. This is undesirable.

There is therefore a need for a signal generator for generating an analog output signal representative of a waveform, and in particular, a square or a stepped waveform which overcomes at least some of the problems of known signal generators.

The present invention is directed towards such a signal generator, and the invention is also directed towards a method for generating an analog signal representative of such a waveform.

SUMMARY OF THE INVENTION

According to the invention there is provided an integrated circuit signal generator for generating an analog output signal representative of a square waveform, the signal generator comprising:

an on-chip DAC having an analog output for outputting the analog output signal representative of the square waveform, an on-chip storing circuit for storing a first digital word and a second digital word corresponding respectively to a maximum analog value and a minimum analog value of the analog output signal, and an on-chip control circuit for selectively and alternately loading the first and second digital words into the DAC for producing the analog output signal representative of the square waveform.

In one embodiment of the invention the control circuit is responsive to an to externally generated signal for loading the first and second digital words into the DAC.

In another embodiment of the invention the frequency of the analog output signal is determined by the frequency of the externally generated signal.

Alternatively, an on-chip signal generating circuit is provided for generating an on-chip generated signal, the control circuit being responsive to the on-chip generated signal for loading the first and second digital words into the DAC. Preferably, the on-chip signal generating circuit is programmable for selecting the frequency of the analog output signal.

Preferably, the storing circuit is programmable for facilitating writing of the first and second digital words corresponding to desired analog maximum and minimum values of the analog output signal.

In one embodiment of the invention the storing circuit comprises an on-chip first digital word storing register for storing the first digital word, and an on-chip second digital word storing register for storing the second digital word.

In another embodiment of the invention an on-chip switch circuit is provided for selectively and alternately switching the first and second digital word storing registers to the DAC.

Preferably, the control circuit outputs a load DAC signal for loading the digital word from the one of the first and second digital word storing registers switched to the DAC, and the switch circuit is responsive to a control signal derived from the load DAC signal for selectively switching the first and second digital word storing registers to the DAC.

In one embodiment of the invention an on-chip DAC register is provided for storing the selected one of the first and second digital words to be loaded into the DAC, the switch circuit being located for selectively and alternately switching the first and second digital word storing registers to the DAC register, and the DAC register is responsive to the load DAC signal for receiving the digital word from the one of the first and second digital word storing registers which is switched to the DAC register.

In another embodiment of the invention an on-chip interface circuit is provided for receiving the externally generated signal to which the control circuit is responsive for selectively and alternately loading the first and second digital words into the DAC.

In one embodiment of the invention the DAC is a voltage DAC and the analog output signal is a voltage signal representative of a voltage square waveform.

Additionally the invention provides an integrated circuit signal generator for generating an analog output signal representative of a step waveform, the signal generator comprising:

an on-chip DAC having an analog output for outputting the analog output signal representative of the step waveform, an on-chip storing circuit for storing a plurality of digital words corresponding to analog step values of the analog output signal, an on-chip control circuit for selectively and sequentially loading the digital words into the DAC for producing the analog output signal representative of the step waveform.

In one embodiment of the invention the control circuit is responsive to an externally generated signal for loading the digital words into the DAC.

In another embodiment of the invention the frequency of the analog output signal is determined by the frequency of the externally generated signal.

Alternatively, an on-chip signal generating circuit is provided for generating an on-chip generated signal, the control circuit being responsive to the on-chip generated signal for loading the digital words into the DAC. Preferably, the on-chip signal generating circuit is programmable for selecting the frequency of the analog output signal.

Preferably, the storing circuit is programmable for facilitating writing of digital words corresponding to desired analog step values of the analog output signal.

In one embodiment of the invention the storing circuit comprises a plurality of on-chip digital word storing registers for storing the respective digital words corresponding to desired analog step values of the analog output voltage.

In one embodiment of the invention an on-chip switch circuit is provided for selectively and sequentially switching the digital word storing registers to the DAC.

In another embodiment of the invention the control circuit outputs a load DAC signal for loading the digital word from the one of the digital word storing registers switched to the DAC, and the switch circuit is responsive to control signals derived from the load DAC signal for selectively switching the digital word storing registers to the DAC.

The invention also provides a method for generating an analog output signal representative of a square waveform in an integrated circuit, the method comprising the steps of:

providing an on-chip DAC on the integrated circuit, storing a first digital word and a second digital word in an on-chip storing circuit of the integrated circuit, the first and second digital words corresponding respectively to a maximum analog value and a minimum analog value of the analog output signal, and selectively and alternately loading the first and second digital words into the DAC for producing the analog signal representative of the square waveform on an analog output of the DAC.

In one embodiment of the invention the first and second digital words are loaded into the DAC in response to an externally generated signal generated externally of the integrated circuit.

In another embodiment of the invention the frequency of the analog output signal is determined by the frequency of the externally generated signal.

Alternatively, the first and second digital words are loaded into the DAC in response to an on-chip generated signal.

The invention further provides a method for generating an analog output signal representative of a step waveform in an integrated circuit, the method comprising the steps of:

providing an on-chip DAC on the integrated circuit, storing a plurality of digital words in an on-chip storing circuit on the integrated circuit, the digital words corresponding to analog step values of the analog output signal, and selectively and sequentially loading the digital words into the DAC for producing the analog signal representative of the step waveform on an analog output of the DAC.

In one embodiment of the invention the digital words are loaded into the DAC in response to an externally generated signal generated externally of the integrated circuit.

In another embodiment of the invention the frequency of the analog output signal is determined by the frequency of the externally generated signal.

Alternatively, the digital words are loaded into the DAC in response to an on-chip generated signal.

ADVANTAGES OF THE INVENTION

The advantages of the integrated circuit signal generator according to the invention are many. The signal generator according to the invention is a particularly simple and non-complex signal generator, and operates efficiently to produce an analog output signal representative of a square or a stepped waveform. The signal generator is particularly simple to operate and requires minimum programming. Where the signal generator is required to produce an analog output signal representative of a square waveform, the first and second digital words corresponding to the desired maximum and minimum voltage values of the analog output signal are written to the storing circuit. Where the control circuit is responsive to an externally generated signal for selectively and alternately loading the first and second digital words into the DAC, a suitable external signal is applied to the control circuit. The frequency of the analog output signal is selected by appropriately selecting the frequency of the external signal. The mark/space ratio of the square waveform of which the analog output signal is representative is also selected by appropriately selecting the external signal. Where the frequency of the analog output signal is to be constant, and the mark/space ratio is to be one, the externally generated signal may be a standard clock signal of constant frequency equal to twice the desired frequency of the analog output signal. On the other hand, if the mark/space ratio of the desired waveform is not to be one, then an externally generated signal of appropriately varying frequency may be applied to the control circuit. The simplicity of the invention when the control circuit is responsive to an externally generated signal for selectively and alternately loading the first and second digital words into the DAC will be evident to any person skilled in the art.

Where the signal generator is required to generate an analog output signal representative of a square waveform, and the signal generator generates an on-chip signal to which the control circuit is responsive for selectively and alternately loading the first and second digital words into the DAC, the first and second digital words corresponding to the desired maximum and minimum voltage values of the analog output signal are written to the storing circuit, and the on-chip signal generator is programmed to output the on-chip generated signal at an appropriate frequency to produce the analog output signal of the desired frequency and mark/space ratio.

Similar advantages are achieved from the signal generator when it is operated for generating an analog output signal representative of a step waveform, since all that is required is to write digital words of appropriate values corresponding to the desired step voltage values of the analog output signal to the storing circuit, and appropriately select the externally generated signal, where the control circuit is responsive to an externally generated signal, to produce the step waveform of the desired frequency, and for maintaining the step voltage values of the analog output signal for the desired time periods. Where the analog output signal is to step through the voltage steps at a constant rate, the external signal may be provided as a standard clock signal of appropriate constant frequency. Alternatively, when the control circuit is responsive to an internally generated signal, the on-chip signal generating circuit is programmed for outputting the internally generated signal of the appropriate frequency for stepping the analog output voltage through the voltage steps at the desired time intervals.

By virtue of the fact that the storing circuit of the signal generator according to the invention is provided on-chip on the integrated circuit, there are no delays in loading the digital words from the storing circuit to the DAC, which otherwise occurs when digital words corresponding to desired voltage values of an output signal are stored in an external circuit and must be transferred from the external circuit to the DAC.

By providing the control circuit to be responsive to an externally generated signal for loading the digital words from the storing circuit into the DAC the frequency of the analog output signal is readily easily selected by selecting the externally generated signal to be of the appropriate frequency. Additionally, the mark/space ratio of a waveform is also readily easily selected by appropriately selecting and varying the frequency of the externally generated signal.

Additionally, when the signal generator is provided with a programmable storing circuit, the voltage values of the analog output signal can be readily easily altered by writing digital input words of appropriate values to the storing circuit corresponding to the desired voltage values.

A still further advantage of the invention is that the signal generator can be provided with a relatively low pin count, in other words, a relatively low number of input and output terminals. In general, all that is required is a single output terminal, and sufficient pins for permitting programming of the storing circuit, where the storing circuit is programmable, and for programming the on-chip signal generating circuit, in cases where an on-chip signal generating circuit is provided. Typically, a single serial data input pin, a SYNC pin and a clock pin is all that should be required for programming the storing circuit and the on-chip signal generating circuit. Where the control circuit is responsive to an externally generated signal, one further pin is all that is required for receiving the externally generated signal. Thus, the provision of a single pin for receiving the externally generated signal permits the frequency and mark/space ratio of the analog output signal to be selected and controlled.

These and other advantages of the invention will be readily apparent to those skilled in the art from the following description of some preferred embodiments thereof, which are given by way of example only, with reference to the accompanying drawings.

BRIEF DESCRIPTION OF THE DRAWINGS

FIG. 1 is a block representation of an integrated circuit signal generator according to the invention for generating an analog output signal representative of a square waveform, FIG. 6 illustrates waveforms of signals of the signal generator of FIG. 5 during operation of the signal generator to produce an analog output signal.

DETAILED DESCRIPTION OF THE INVENTION

Figure 2:
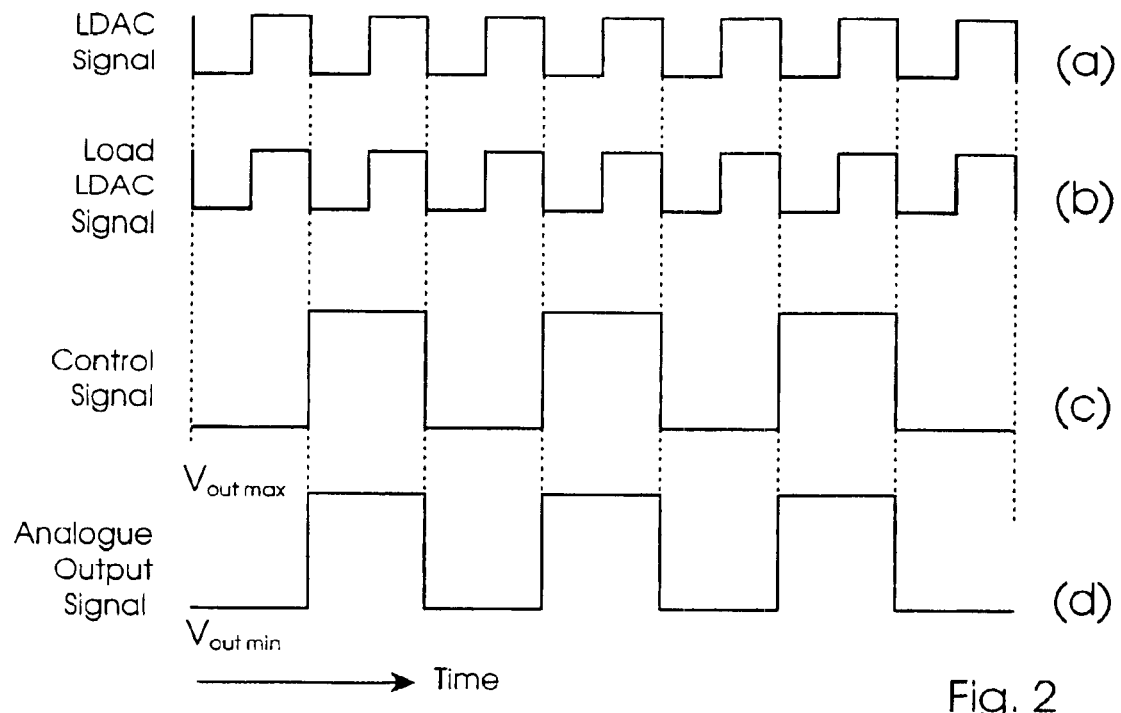
FIG. 2 illustrates waveforms of signals of the signal generator of FIG. 1 during operation of the signal generator to produce an analog output signal.

Referring to the drawings and initially to FIG. 1, there is illustrated an integrated circuit signal generator according to the invention, indicated generally by the reference numeral 1, for generating an analog output voltage signal representative of a square waveform. The signal generator 1 is implemented as an integrated circuit chip by a CMOS process. The signal generator 1 comprises a supply voltage terminal 2 for receiving a supply voltage $V_{dd}$, and a ground terminal 3 for grounding the signal generator 1. The analog output voltage signal is outputted on an output terminal 5. The signal generator 1 comprises an on-chip storing circuit 8 which in this embodiment of the invention comprises an on-chip programmable first digital word storing register 9 for storing a first digital word corresponding to the maximum voltage value of the square waveform analog output voltage signal, and an on-chip programmable second digital word storing register 10 for storing a second digital word corresponding to the minimum voltage value of the square waveform analog output voltage signal.

An on-chip voltage digital to analog converter (DAC) 12, the analog output 13 of which is connected to the output terminal 5 produces the analog output voltage signal on the output terminal 5 by converting the first and second digital words stored in the first and second registers 9 and 10. A reference voltage $V_{ref}$ is applied to the DAC 12, and may be generated on-chip or supplied from an external source. The first and second digital words are selectively and alternately loaded into the DAC 12 under the control of an on-chip control circuit 14 and an on-chip switch circuit 15 for producing the analog output signal representative of the square waveform. An on-chip DAC register 17 holds the one of the first and second digital words during conversion by the DAC 12. The switch circuit 15 selectively and alternately switches the first and second registers 9 and 10 to the DAC register 17 in response to a control signal from an on-chip D-type flip-flop 19 under the control of the control circuit 14 as will be described below.

A load DAC signal on a load DAC line 20 from the control circuit 14 opens the DAC register 17 to the one of the first and second registers 9 and 10 switched through to the DAC register 17 by the switch circuit 15 for receiving the corresponding one of the first and second digital words, and for transferring the first and second digital words to the DAC 12. In this embodiment of the invention the load DAC signals on the load DAC line 20 are generated by the control circuit 14 in response to an externally generated signal which is applied to an input terminal identified as an LDAC terminal 22. The externally generated signal applied to the LDAC terminal 22 is relayed to the control circuit 14 through an on-chip interface circuit 24. The externally generated signal applied to the LDAC terminal 22 is illustrated by the waveform (a) of FIG. 2, and will be described below.

The switch circuit 15 comprises two on-chip digital switches, namely, a digital switch S1 which switches the first register 9 to the DAC register 17, and a second digital switch S2 which switches the second register 10 to the DAC register 17. In this embodiment of the invention the control signal for operating the switches S1 and S2 is derived by the flip-flop 19 from the load DAC signal on the load DAC line 20. The flip-flop 19 is configured with its negative Q output connected to its DATA input, and the control signal is derived from its positive Q output, which is applied to the first switch S1 through a control line 25. The load DAC signal on the load DAC line 20 is applied to the clock input of the flip-flop 19. The flip-flop 19 can be reset on power up by a reset signal from the control circuit 14, or may be reset by an external reset signal received through the interface circuit 24.

The first switch S1 is responsive to the control signal on the control line 25 and remains in a closed circuit state holding the first register 9 switched to the DAC register 17 while the control signal on the control line 25 from the flip-flop 19 remains high, and goes into an open circuit state isolating the first register 9 from the DAC register 17 when the control signal from the flip-flop 19 goes low. An inverter 26 inverts and applies the control signal on the control line 25 to the second switch S2, which also remains in a closed circuit state while the inverted control signal applied from the inverter 26 to the second switch S2 is high, thus holding the second register 10 switched to the DAC register 17. The second switch S2 goes into an open circuit state when the inverted control signal from the inverter 26 goes low, thus isolating the second register 10 from the DAC register 17. Accordingly, while the control signal from the flip-flop 19 remains high, the first switch S1 is in a closed circuit state and the second switch S2 is in an open circuit state, and vice versa when the control signal from the flip-flop 19 goes low.

Referring now in particular to FIG. 2, the waveform (a) as discussed above represents the externally generated signal applied to the LDAC terminal 22. The externally generated signal is a clock signal of constant frequency, and for convenience is hereafter referred to as the LDAC signal. The waveform (b) of FIG. 2 represents the load DAC signal which is generated by the control circuit 14 in response to the LDAC signal (a), and which is applied to the load DAC line 20. As can be seen, the frequency of the load DAC signal is identical to that of the LDAC signal. The DAC register 17 is responsive to each falling edge of the load DAC signal for receiving and transferring the one of the first and second digital words from the one of the first and second registers 9 and 10 which is switched to the DAC register by the switches S1 and S2.

The waveform (c) of FIG. 2 represents the control signal outputted by the flip-flop 19 on the control line 25. The control signal changes from high to low and from low to high on alternate falling edges of the load DAC signal. Accordingly, on each falling edge of the load DAC signal the conducting states of the first and second switches S1 and S2 are reversed, thus alternately switching the first and second registers 9 and 10 to the DAC register 17. As the first and second registers 9 and 10 are switched to the DAC register 17, the load DAC signal on the load DAC line 20 opens the DAC register to receive the digital word from the one of the first and second registers 9 and 10 just switched to the DAC register 17, which is then transferred to the DAC 12.

The waveform (d) of FIG. 2 represents the analog output signal from the DAC 12 which is outputted on the output terminal 5. The analog output signal is representative of a square waveform of mark/space ratio of one, which swings between a maximum voltage of $V_{outmax}$ corresponding to the first digital word, and a minimum voltage $V_{outmin}$ corresponding to the second digital word. Accordingly, on each falling edge of the load DAC signal on the load DAC line 20, the analog output voltage on the output terminal 5 swings between the maximum voltage $V_{outmax}$ and the minimum voltage $V_{outmin}$. Thus, since the load DAC signal on the load DAC line 20 outputted by the control circuit 14 is derived directly from the LDAC signal, the frequency of the analog output signal is determined directly by the LDAC signal, and is half the frequency of the LDAC signal. Accordingly, the frequency of the analog output signal is selected in this embodiment of the invention by appropriately selecting the frequency of the externally generated LDAC signal to be twice the desired frequency of the analog output signal.

Additionally, the mark/space ratio of the square waveform may be selected to be other than one by varying the frequency of the LDAC signal as will be discussed below.

Three input terminals, namely, a serial data input (SDIN) terminal 28, a clock terminal 29 and a SYNC terminal 30 are provided to the interface circuit 24 for facilitating writing of the first and second digital words corresponding to desired maximum and minimum voltage values of the analog digital output signal to the first and second registers 9 and 10.

In use, with a supply voltage $V_{dd}$ applied to the supply voltage terminal 2 and the is ground terminal 3 grounded, first and second digital input words corresponding to desired maximum and minimum voltage values of the analog output signal are written to the first and second registers 9 and 10 through the SDIN terminal 28 using the clock terminal 29 and the SYNC terminal 30 for framing the respective digital words. The externally generated LDAC signal of appropriate frequency to provide the analog output voltage signal of the desired frequency is applied to the LDAC terminal 22. The control circuit 14 derives the load DAC signal from the LDAC signal, which is applied to the load DAC line 20. On each falling edge of the LDAC signal, and in turn on each falling edge of the load DAC signal on the load DAC line 20, the voltage of the analog output signal swings between the high and low voltages $V_{outmax}$ and $V_{outmin}$ corresponding to the first and second digital words stored in the first and second digital registers 9 and 10, respectively. When the LDAC signal is a clock signal of constant frequency, the frequency of the analog output signal is half the frequency of the LDAC signal applied to the LDAC terminal 22, and the mark/space ratio of the analog output signal is one.

Figure 3:
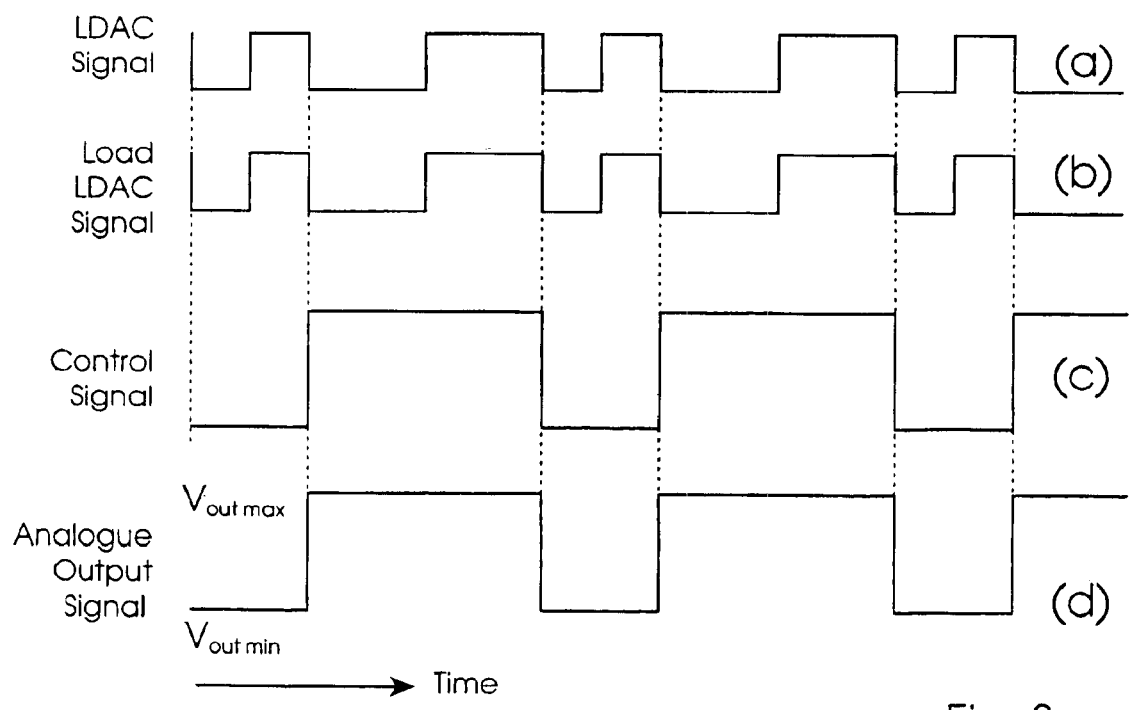
FIG. 3 illustrates waveforms of signals of the signal generator of FIG. 1 during operation of the signal generator to produce an alternative analog output signal to that illustrated by the waveforms of FIG. 2.

Referring now to FIG. 3, waveforms (a) to (d) which correspond to the waveforms (a) to (d) of FIG. 2, represent corresponding signals when the LDAC signal of waveform (a) applied to the LDAC terminal 22 of the signal generator 1 is chosen to produce an analog output signal of constant frequency with a mark/space ratio greater than one, see waveform (d) of FIG. 3. In this case, the LDAC signal of waveform (a) is of varying frequency, so that the falling edges of the LDAC signal of waveform (a) occur at appropriate time intervals, so that the load DAC signal of waveform (b) which is generated by the control circuit 14 from the LDAC signal of waveform (a), likewise presents a falling edge at appropriate time intervals for loading the first and second digital words into the DAC 12. Since the control signal outputted by the flip-flop 19 is derived from the load DAC signal of waveform (b), on each falling edge of the load DAC signal of waveform (b), the polarity of the control signal of waveform (c) is altered, thereby appropriately switching the first and second registers 9 and 10 to the DAC register 17 at the appropriate times for loading the first and second digital words into the DAC 12 for producing the analog output signal of waveform (d). The analog output signal of waveform (d) is a square waveform of constant frequency and of mark/space ratio equal to two.

Needless to say, analog output signals of other mark/space ratios may be produced by the signal generator 1 by appropriately selecting the frequencies of the externally generated LDAC signal.

Figure 4:
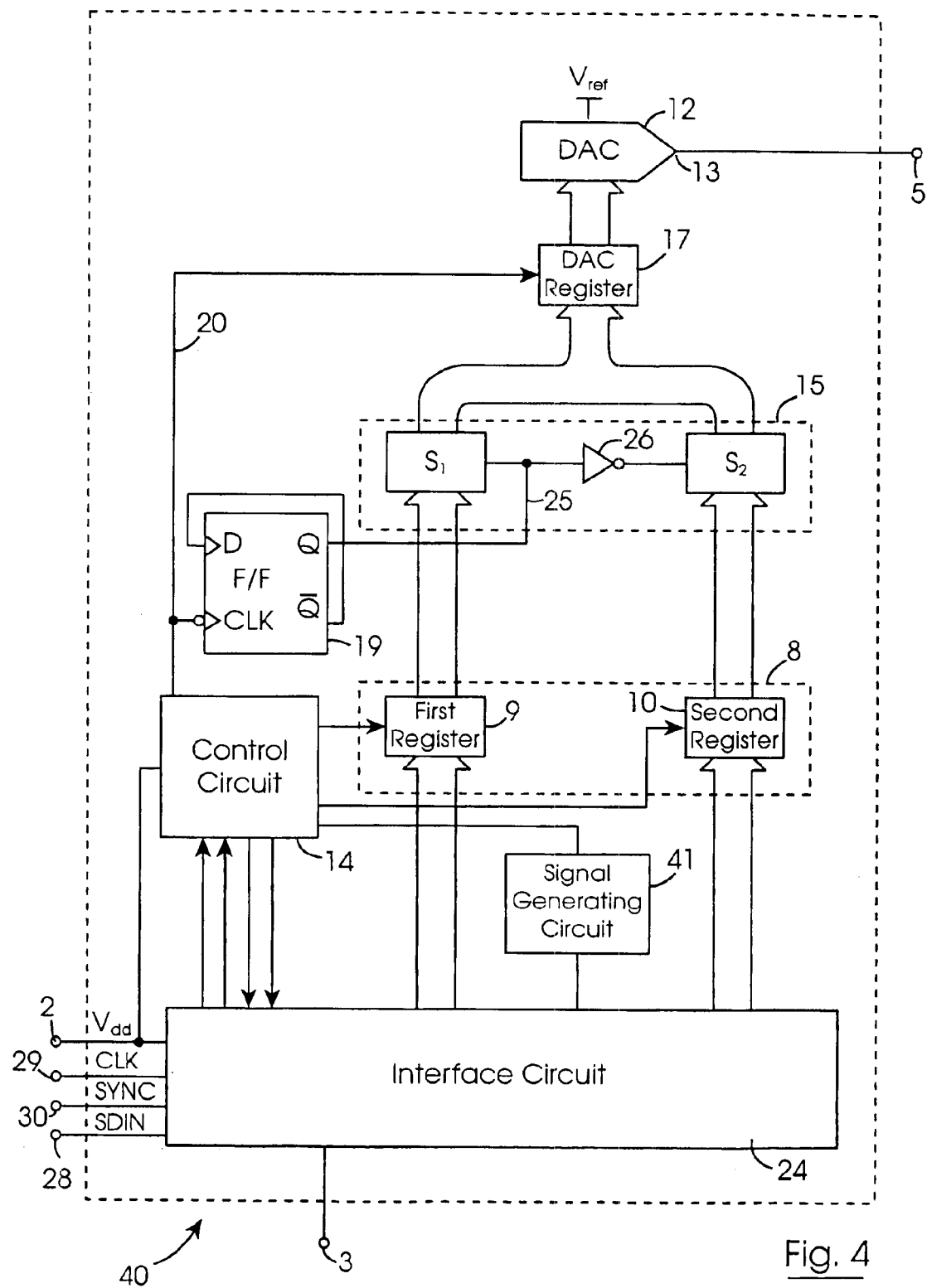
FIG. 4 is a block representation of an integrated circuit signal generator according to another embodiment of the invention also for generating an analog output signal representative of a square waveform.

Referring now to FIG. 4, there is illustrated an integrated circuit signal generator according to another embodiment of the invention indicated generally by the reference numeral 40. The signal generator 40 is substantially similar to the signal generator 1, and similar components are identified by the same reference numerals. The main difference between the signal generator 40 and the signal generator 1 is that in the signal generator 40 the load DAC signal is generated by the control circuit 14 in response to an on-chip generated signal, which in this embodiment of the invention is generated by a programmable on-chip signal generating circuit 41. The signal generating circuit 41 is programmable through the SDIN terminal 28, the clock terminal 29 and the SYNC terminal 30 through the interface circuit 24 for outputting a clock signal to the control circuit 14, similar to the externally generated LDAC signal illustrated in FIG. 2 from which the control circuit 14 generates the load DAC signal which is in turn applied to the load DAC line 20.

In use, first and second digital words corresponding to the maximum and minimum voltage values of the analog output signal are written to the first and second registers 9 and 10 through the SDIN terminal 28 using the clock terminal 29 and the SYNC terminal 30 to frame the respective digital words, and in turn through the interface circuit 24. The signal generating circuit 41 is also programmed through the SDIN terminal 28, the clock terminal 29 and the SYNC terminal 30 to output a signal to the control circuit 14 of the appropriate frequency.

With a relatively simple signal generating circuit 41, analog output signals of a relatively wide range of desired frequencies and mark/space ratios of one can be produced by the signal generator 40. However, where analog output signals of mark/space ratio other than one, additional logic circuitry would be required with the signal generating circuit 41 for providing a signal to the control circuit 14, so that the appropriate load DAC signal would be generated by the control circuit 14. This will be readily apparent to those skilled in the art.

Figure 5:
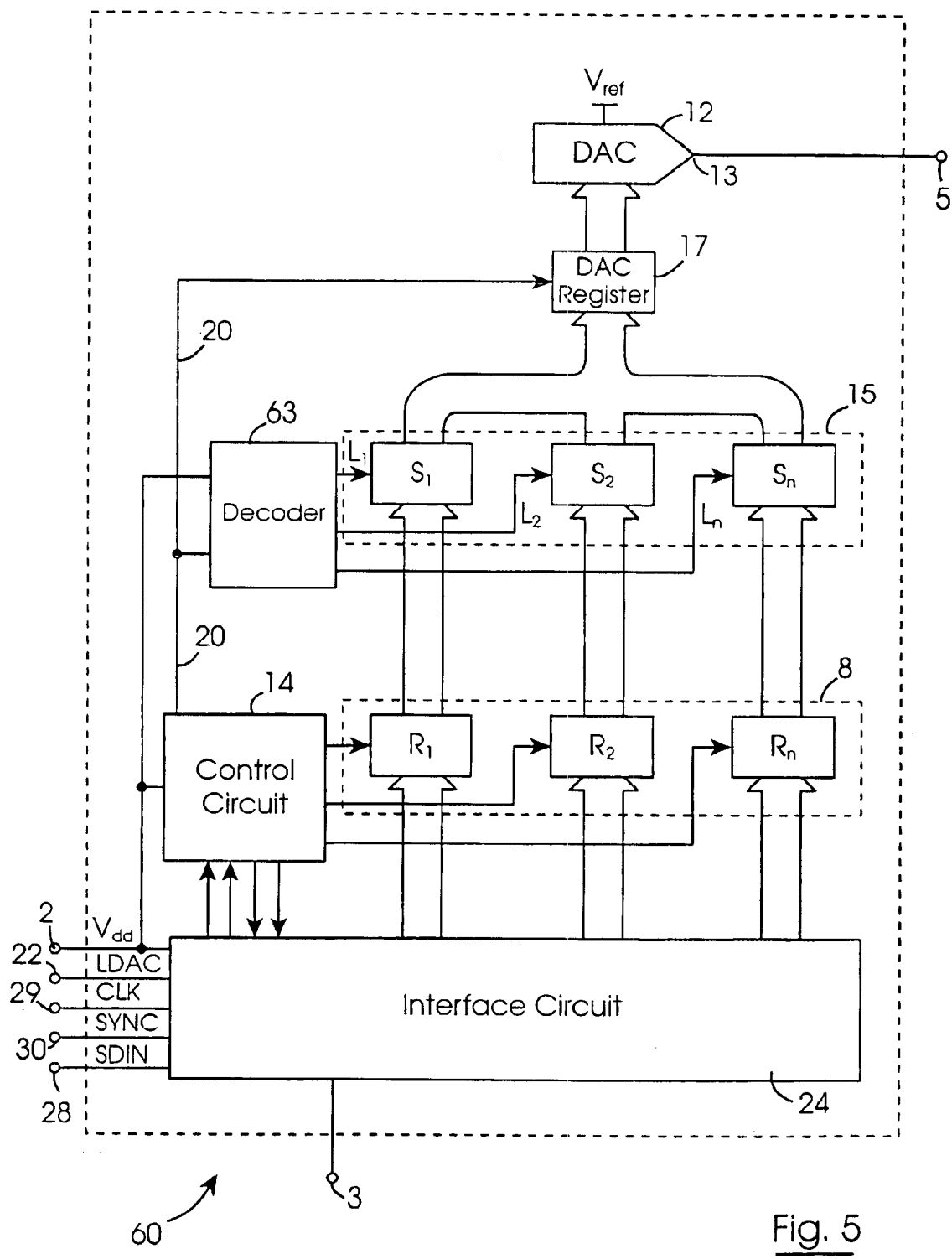
FIG. 5 is a block representation of an integrated circuit signal generator also according to the invention for generating an analog output signal representative of a step waveform.

Referring now to FIG. 5, there is illustrated an integrated circuit signal generator according to another embodiment of the invention, indicated generally by the reference numeral 60. The signal generator 60 is substantially similar to the signal generator 1 and similar components are identified by the same reference numerals. In this embodiment of the invention while the signal generator 60 is suitable for outputting an analog output signal representative of a square waveform, the signal generator 60 is also suitable for outputting a step waveform, of the type, for example, illustrated by the waveform (d) in FIG. 6. In this embodiment of the invention the storing circuit 8 comprises N on-chip programmable digital word storing registers, namely, digital word storing registers $R_1$ to $R_n$ for storing up to N digital words corresponding to N desired voltage steps of the analog output signal. The switch circuit 15 comprises N on-chip digital switches, namely, switches $S_1$ to $S_n$ for switching the respective registers $R_1$ to $R_n$ selectively and sequentially to the DAC register 17. The control circuit 14 is responsive to an externally generated LDAC signal applied to the LDAC terminal 22 for generating a load DAC signal, which is applied to the load DAC line 20 for opening the DAC register 17 for receiving the digital words from the registers $R_1$ to $R_n$ as they are switched through to the DAC register 17 by the switches $S_1$ to $S_n$ and for in turn transferring the digital word in the DAC register 17 to the DAC 12.

An on-chip decoder 63 is responsive to the load DAC signal on the load DAC line 20 for determining the sequence in which the registers $R_1$ to $R_n$ are to be switched by the switches $S_1$ to $S_n$ to the DAC register 17. The switches $S_1$ to $S_n$ are responsive to enable signals outputted by the decoder 63 on the lines $L_1$ to $L_n$ for switching the register $R_1$ to $R_n$ through to the DAC register 17 in the appropriate sequence.

In use, digital words corresponding to the desired step voltage values through which the analog output signal is to be stepped are written to the digital word storing registers $R_1$ to $R_n$ as already described with reference to the signal generator 1 of FIG. 1. The sequence in which the digital word storing registers $R_1$ to $R_n$ are to be switched to the DAC register 17 is programmed into the decoder 63 through the SDIN terminal 28, the clock terminal 29 and the SYNC terminal 30 and through the interface circuit 24. An LDAC signal of the appropriate frequency is applied to the LDAC terminal 22. The control circuit 14 generates the load DAC signal from the LDAC signal on the LDAC terminal 22 as already described with reference to the signal generator 1 of FIG. 1, and the load DAC signal is applied to the load DAC line 20. The decoder 63 in response to the load DAC signal enables the switches $S_1$ to $S_n$ in the appropriate sequence, so that the digital words in the digital word storing registers $R_1$ to $R_n$ are switched through to the DAC register 17 in the appropriate sequence.

Referring now to FIG. 6, the analog output signal of the stepped waveform (d) of FIG. 6 is generated in response to an LDAC signal provided by a clock signal of constant frequency which is represented by the waveform (a) of FIG. 6. The waveform (b) represents the load DAC signal generated by the control circuit 14 from the LDAC signal of the waveform (a). The decoder outputs a high signal to each of the switches $S_1$ to $S_n$ for the period during which the respective switches $S_1$ to $S_n$ are to operate in a closed circuit state for switching the corresponding one of the registers $R_1$ to $R_n$ to the DAC register 17. To produce the analog output signal of the waveform (d) of FIG. 6 four digital word storing registers $R_1$ to $R_4$ are required to store four digital words corresponding to the four voltage step values through which the analog voltage is stepped.

Otherwise, use and operation of the signal generator 60 is similar to that of the signal generator 1 of FIG. 1.

While the signal generators have been described as comprising programmable digital word storing registers, while it is desirable, it is not essential that the digital word storing registers should be programmable. Additionally, while the signal generator described with reference to FIG. 4 has been described as comprising a programmable on-chip signal generating circuit, while this is desirable, it is not essential.

While the signal generators have been described for outputting analog output signals of specific waveforms, it will be readily apparent to those skilled in the art that the signal generators described with reference to the drawings may be provided for outputting analog output signals of different waveforms, and such other waveforms would be produced by appropriately programming the digital word storing registers and where the signal generator is provided with a programmable on-chip signal generating circuit, appropriately programming the on-chip signal generating circuit, or otherwise, appropriately selecting the externally generated LDAC signal to be applied to the signal generator.

While the DAC register, the flip-flop and the decoder have been described as being responsive to the falling edge of the load DAC signal, it will be readily apparent to those skilled in the art that instead of being responsive to the falling edge, they could be responsive to the rising edge of the load DAC signal.

While the digital word storing registers, the signal generating circuit 41 and the decoder have been described as being programmable through a serial interface, any other suitable interface, for example, a parallel interface, an I²C interface may be provided.

While the signal generator described with reference to FIG. 5 has been described as comprising N digital word storing registers, it is envisaged that when the signal generator of FIG. 5 is being used to generate a step waveform, all N registers need not necessarily be used. For example, the appropriate number of digital word storing registers corresponding to the number of steps in the step waveform would be programmed with digital words of value corresponding to the step voltage values, and the decoder would be appropriately programmed.

What is claimed is:

1. An integrated circuit signal generator for generating an analog output signal representative of a square waveform, the signal generator comprising:
   an on-chip DAC having an analog output for outputting the analog output signal representative of the square waveform,
   an on-chip storing circuit comprising an on-chip first digital word storing register for storing a first digital word corresponding to a maximum analog value of the analog output signal, and an on-chip second digital word storing register for storing a second digital word corresponding to a minimum analog value of the analog output signal,
   an on-chip switch circuit for selectively and alternatively switching the first and second digital word storing registers to the DAC, and
   an on-chip control circuit for controlling the switch circuit for selectively and alternately loading the first and second digital words from the respective first and second digital word storing registers into the DAC for producing the analog output signal representative of the square waveform.

2. An integrated circuit signal generator as claimed in claim 1 in which the control circuit is responsive to an externally generated signal for loading the first and second digital words into the DAC.

3. An integrated circuit signal generator as claimed in claim 2 in which the frequency of the analog output signal is determined by the frequency of the externally generated signal.

4. An integrated circuit signal generator as claimed in claim 2 in which an on-chip interface circuit is provided for receiving the externally generated signal to which the control circuit is responsive for selectively and alternately loading the first and second digital words from the respective first and second digital word storing registers into the DAC.

5. An integrated circuit signal generator as claimed in claim 1 in which an on-chip signal generating circuit is provided for generating an on-chip generated signal, the control circuit being responsive to the on-chip generated signal for loading the first and second digital words into the DAC.

6. An integrated circuit signal generator as claimed in claim 5 in which the on-chip signal generating circuit is programmable for selecting the frequency of the analog output signal.

7. An integrated circuit signal generator as claimed in claim 1 in which the storing circuit is programmable for facilitating writing of the first and second digital words corresponding to desired analog maximum and minimum values of the analog output signal to the respective first and second digital word storing registers.

8. An integrated circuit signal generator as claimed in claim 1 which the control circuit outputs a load DAC signal for loading the digital word from the one of the first and second digital word storing registers switched to the DAC, and the switch circuit is responsive to a control signal derived from the load DAC signal for selectively switching the first and second digital word storing registers to the DAC.

9. An integrated circuit signal generator as claimed in claim 8 in which an on-chip DAC register is provided for storing the selected one of the first and second digital words to be loaded into the DAC, the switch circuit being responsive to the control signal for selectively and alternately switching the first and second digital word storing registers to the DAC register, and the DAC register is responsive to the load DAC signal for receiving the digital word from the one of the first and second digital word storing registers which is switched to the DAC register.

10. An integrated circuit signal generator as claimed in claim 1: in which the DAC is a voltage DAC and the analog output signal is a voltage signal representative of a voltage square waveform.

11. An integrated circuit signal generator for generating an analog output signal representative of a step waveform, the signal generator comprising:
   an on-chip DAC having an analog output for outputting the analog output signal representative of the step waveform,
   an on-chip storing circuit comprising a plurality of on-chip digital word storing registers for storing respective digital words corresponding to desired analog step values of the analog output signal, an on-chip switch circuit for selectively and sequentially switching the digital word storing registers to the DAC, and an on-chip control circuit for controlling the switch circuit for selectively and sequentially loading the digital words into the DAC for producing the analog output signal representative of the step waveform, the control circuit being responsive to an externally generated signal for loading the digital words into the DAC.

12. An integrated circuit signal generator as claimed in claim 11 in which the frequency of the analog output signal is determined by the frequency of the externally generated signal.

13. An integrated circuit signal generator as claimed in claim 11 in which the storing circuit is programmable for facilitating writing of digital words corresponding to desired analog step values of the analog output signal to the digital word storing registers.

14. An integrated circuit signal generator as claimed in claim 11 in which the control circuit outputs a load DAC signal for loading the digital word from the one of the digital word storing registers switched to the DAC, and the switch circuit is responsive: to control signals derived from the load DAC signal for selectively switching the digital word storing registers to the DAC.

15. A method for generating an analog output signal representative of a square waveform in an integrated circuit, the method comprising the steps of:

providing an on-chip DAC in the integrated circuit, providing an on-chip storing circuit with an on-chip first digital word storing register and an on-chip second digital word storing register in the integrated circuit, and storing a first digital word and a second digital word in the respective first and second digital word storing registers the first and second digital words corresponding respectively to a maximum analog value and a minimum analog value of the analog output signal, providing an on-chip switch circuit in the integrated circuit for selectively and alternately switching the first and second digital word storing registers to the DAC, providing an on-chip control circuit in the integrated circuit for controlling the switch circuit, and operating the control circuit for controlling the switch circuit for selectively and alternately switching the first and second digital word storing registers to the DAC for selectively and alternately loading the first and second digital words from the first and second digital word storing registers, respectively, into the DAC for producing the analog signal representative of the square waveform on an analog output of the DAC.

16. A method as claimed in claim 15 in which the control circuit is operated in response to an externally generated signal generated externally of the integrated circuit for controlling the switch circuit for selectively and alternately switching the first and second digital words to the DAC.

17. A method as claimed in claim 16 in which the frequency of the analog output signal is determined by the frequency of the externally generated signal.

18. A method as claimed in claim 15 in which the control circuit is operated in response to an on-chip generated signal for controlling the switch circuit for selectively and alternately switching the first and second digital words to the DAC.

19. A method for generating an analog output signal representative of a step waveform in an integrated circuit, the method comprising the steps of:

providing an on-chip DAC Gn in the integrated circuit, providing an on-chip storing circuit with a plurality of on-chip digital word storing registers in the integrated circuit, and storing a plurality of digital words in the respective digital word storing registers, the digital words corresponding to respective analog step values of the analog output signal, providing an on-chip switch circuit in the integrated circuit for selectively and sequentially switching the digital word storing registers to the DAC, providing an on-chip control circuit in the integrated circuit for controlling the switch circuit, and operating the control circuit in response to an externally generated signal generated externally of the integrated circuit for controlling the switch circuit for selectively and sequentially switching the first and second digital word storing registers to the DAC for selectively and sequentially loading the digital words from the respective digital word storing registers into the DAC for producing the analog signal representative of the step waveform on an analog output of the DAC.

20. A method as claimed in claim 19 which the frequency of the analog output signal is determined by the frequency of the externally generated signal.

* * * * *